United States Patent [19] [11] 3,793,630

Meijer [45] Feb. 19, 1974

[54] PYROMETER WITH DIGITALIZED LINEARIZING CORRECTION

[75] Inventor: Robert S. Meijer, Chicago, Ill.

[73] Assignee: Alnor Instrument Company, Div. of Illinois Testing Laboratories, Inc., Chicago, Ill.

[22] Filed: June 14, 1971

[21] Appl. No.: 152,702

[52] U.S. Cl. ........ 340/347 NT, 235/183, 324/99 D, 235/92 R, 235/92 PL

[51] Int. Cl. .......................................... H03k 13/20

[58] Field of Search.............................. 340/347 NT

[56] References Cited

UNITED STATES PATENTS

| | | | |
|---|---|---|---|
| 3,051,939 | 8/1962 | Gilbert | 340/347 AD |
| 3,686,665 | 8/1972 | Elias | 235/92 PL |
| 3,316,547 | 4/1967 | Ammann | 340/347 NT |
| 3,349,390 | 10/1967 | Glassman | 340/347 NT |
| 3,569,957 | 3/1971 | Masterson | 340/347 NT |
| 3,566,265 | 2/1971 | Reid | 340/347 NT |

FOREIGN PATENTS OR APPLICATIONS

| | | | |
|---|---|---|---|
| 1,213,634 | 11/1970 | Great Britain | 340/347 |

*Primary Examiner*—Paul J. Henon
*Assistant Examiner*—Robert F. Gnuse
*Attorney, Agent, or Firm*—Silverman & Cass

[57] ABSTRACT

By feeding BCD temperature representing count pulses into simple gating logic, progressively selected count pulses are discarded to cause a nonlinear thermocouple response to become linearized. The thermocouple response is fed into an improved dual slope integrator; whereby, pulse width modulation becomes a proportional measurement of sensed temperature. A novel slide back detector effectively increases the slewing rate of the output end of the double slope integrator.

20 Claims, 4 Drawing Figures

Inventor
ROBERT S. MEIJER
BY Silverman & Cass
ATTYS.

PYROMETER WITH DIGITALIZED LINEARIZING CORRECTION

BACKGROUND OF THE INVENTION

This invention concerns a pyrometer and, more particularly, an especially accurate, fast responding electronic pyrometer with digitalized linearization.

The nonlinear output response of thermocouples, and for that matter other types of transducers, has long been recognized. As technology progressed, the need for greater measurement accuracy proportionately increased, such that at the present time one or two percent of error in various measurements, such as temperature, has become significant. Often, because of the nature of an input transducer, errors are progressive over a known range; hence, a tolerable degree of error at the low end of the range soon changes to an unacceptable quantum of error by midrange and thereabove. Often the error is monotonic in nature, as is known in thermocouples.

Such nonlinearity has been dealt with previously by the use of compensating meter movements which are designed to possess an equal, yet opposite nonlinear response characteristic. Nonlinear electronic elements, such as diodes and potentiometers have been employed for linearization. Servo mechanisms of varying complexity and cost also have been employed.

The known prior art has been of the type in which linearization has been accomplished primarily in an analog method; hence, there has been the need for moving parts, which typically are costly, occupy a relatively large amount of space, are slow to react and are subject to the inertia disadvantage of overshoot.

Most, if not all of the prior art deficiencies can be overcome by analog to digital conversion of the error and digitalized linearization.

SUMMARY OF THE INVENTION

It is a primary object of this invention to provide an improved pyrometer which is digitally linearized with high precision.

Another object of this invention is to provide improvement in dual slope integration, especially as used in temperature measurements.

The above and other objects of the invention are accomplished by feeding the thermocouple output to a dual slope integrator specially designed such that its gain can be fine tuned without generating any amplifier offset. In this manner one degree of temperature will be made to equal to one eventually resulting, digitalized count pulse with great precision. The zero detector output of the dual slope integrator is given a high slew rate by a slide back detector having a programmable unijunction switch. The thus generated temperature proportional, pulse width modulated signal is employed for generating and gating a strobe signal which causes the linearized and digitalized temperature value to be latched for display on glow tubes and made available in BCD readout format. As the BCD value is being accumulated digit by digit, certain BCD counts are fed into the linearizing circuit, which gates a continuous train of clock pulses into BCD counters. All clock pulses are gated, except for those selected by the linearizer for exclusion,such that the monotonic error progression is suppressed and the gated clock pulses become a train of linearized count pulses which is strobed, as above noted, so that at the time of the strobe, the temperature value is in the BCD counters.

DISCLOSURE OF THE PREFERRED EMBODIMENT

Figures 1, 2, 3, 4:
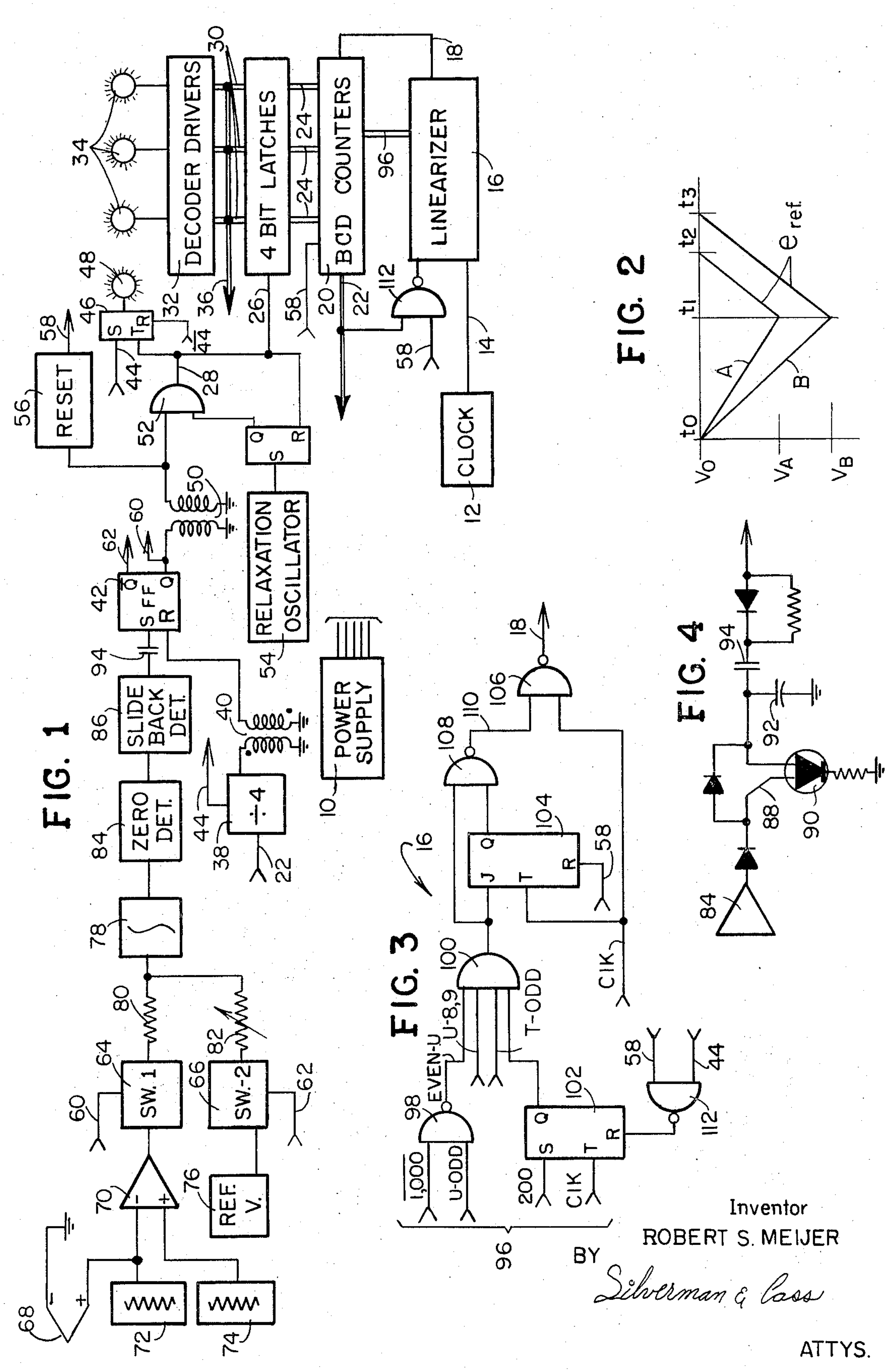
FIG. 1 is schematic of the subject pyrometer.
FIG. 2 is a voltage chart relating to the dual slope operation.
FIG. 3 is a schematic of the linearizing circuit.
FIG. 4 is a schematic of the slide back detector.

With reference to FIG. 1, a floating power supply 10 is shown with a plurality of outputs; however, for simplicity of illustration and discussion the interconnections from the power supply to the other circuit elements have been omitted as well as the power transformer input to the power supply. It will be appreciated that several voltage levels and a common level are provided by the power supply 10.

A clock 12 is energized by the power supply and generates a continuous train of clock pulse, such as at the rate of 750 KHz. A free running multivibrator will function well for this clock. An output line 14 connects the clock pulses to a linearizer 16, the contents and detailed operation of which will be discussed subsequently with reference to FIG. 3. It is sufficient for the moment to state that the linearizer suppresses selected of the clock pulses and passes to its output line 18, a linearized train of count pulses for receipt by a plurality of interconnected BCD counters 20.

As well known in the art, binary coded decimal (BCD) devices operate upon the digit values of 1, 2, 4 and 8. In the present embodiment, three BCD counters 20 are employed with carry connections, such that they can receive up to the pulse count value of 999 before overflowing. Upon overflowing, an overflow or 1,000 count signal is placed on a line 22 for timing purposes, soon to be discussed. By conduits 24, the BCD values are applied to four-bit latches 26 and when the latter are strobed by a strobe signal on a line 28, they transfer, via conduits 30, to decoder drivers 32, for energizing of numerical indicating tubes 34, the BCD values they are then receiving. At the same time the BCD count value is placed on a BCD readout conduit 36 for recording purposes. Such counters, latches, drivers and indicating tubes are well known in the art and can be obtained in commercial packages.

The above mentioned 1,000 count signal on the line 22 is applied to a divide by four circuit 38, which can comprise a pair of flip-flops, and generates a 4,000 count output. This output is applied to a transformer 40 which resets a flip-flop 42 to thereby establish a fixed count duration for the first half of the dual slope integration operation. Such fixed count duration is shown in FIG. 2 as lying between times $t_0$ and $t_1$. During the second half of the dual slope operation, between $t_1$ and for example $t_2$, which is at a "return to $V_0$" condition, the number of count pulses which are fed into the BCD counters by the time that the slope signal returns to $V_0$ is the linearized temperature being measured. If by that time between $t_1$ and $t_2$ there is an overflow signal on the line 22, a response signal is emitted from the divide by four circuit on an output line 44, and such signal is gated by a flip-flop 46 with the strobe signal on the line 28 to thereby turn on a lamp 48, which represents the 1,000 count value.

Whenever, during the second half of the dual slope operation, the integrated value returns to $V_0$, the flip-flop 42 changes state and produces an output which is applied to a transformer 50. That "zero return" output is gated by a gate 52 with the output from a relaxation oscillator 54 to generate the strobe signal for the strobe line 28. Connected between the output of the relaxation oscillator and the gate 52 is a set reset flip-flop 55 that is set by the oscillator and reset by the trailing edge of the strobe signal. The relaxation oscillator has a relatively slow repetition rate, such as one second, so that there is sufficient visual resolution of the indicator tubes 34 when strobed, otherwise the visual readout might be difficult to use, even though precisely accurate. The zero return signal also triggers a reset element 56 having an output line 58 that is coupled to several of the circuit portions, as shown.

The flip-flop 42 also has a pair of complementing output lines 60 and 62 which change state at each time $t_1$ and whenever the integrated slope voltage is at $V_0$. A pair of parallel switches 64 and 66 are separately enabled by the output lines 60 and 62 such that at any one time only one of these switches is enabled. More specifically, the first switch 64 is enabled during the first half of each integration, i.e., between $t_0$ and $t_1$, while the second switch 66 is disabled, and the second switch is enabled at $t_1$, when the first switch is disabled.

The switch 64 receives the analog of the millivolt output from a thermocouple 68 by way of an operational amplifier 70. The amplifier allows the thermocouple to see a high impedance and also amplifies its output voltage. A nickel spool 72 and a manganin spool 74 provide cold end compensation and offset, in the manner known in the pyrometer art. Reference voltage means 76, such as a Zener diode circuit, provides a reference voltage to the second switch 66, whereby a fixed voltage $e_{ref}$ will be generated and at time $t_1$ be fed to an integrator 78. As shown in FIG. 2, the thus formed reference voltage $e_{ref}$ produces a fixed slope, independent of the voltage level at which it commences at the time $t_1$.

Accordingly, if the amplified thermocouple output through the first switch 64 represented a temperature "A", there would be integrated a ramp signal "A", commencing at the time $t_0$ and terminating at the time $t_1$. The duration $t_0$ to $t_1$, it will be recalled, is fixed, always being 4,000 count pulses in duration. At time $t_1$, the flip-flop 42 changes state and causes the first switch 64 to stop transmitting the thermocouple data to the integrator 78, and then the second switch 66 feeds the reference voltage to the integrator until the time $t_2$, when the ascending slope $e_{ref}$ returns to $V_0$. The flip-flop 42 again changes state, as next will be discussed, and the cycle repeats itself.

If at $t_0$ the thermocouple 68 was reporting a temperature "B" which was greater than the temperature "A", a descending ramp "B" would be formed, as shown in FIG. 2, and cause the associated ascending reference voltage ramp to attain $V_0$ at the time $t_3$. It now will be appreciated that the input temperatures are proportional to the duration of the ascending ramp voltages, and that such duration is subdivided by the train of clock pulses into a digitalized representation of the temperature, which is then linearized by the digitalized linearizer 16 such that each count pulse passed therefrom to the BCD counters 20 represents one degree of temperature for readout purposes.

As shown in FIG. 1, the output from the first switch 64 is applied to a resistor 80 and the output from the parallel switch 66 is applied to a variable resistor 82. By use of the variable resistor 82, the ascending slope $e_{ref}$ can be fine tuned for precise matching of one count pulse to one degree of temperature. In previously known dual slope integration, the just described configuration was unknown and fine tuning was attempted by shifting the voltage gain of the input amplifier 70, a less desirable and less precise arrangement.

A zero detector 84 follows the output of the integrator 78 and whenever $V_0$ is attained the detector produces the characteristic "zero return" output earlier discussed. The switchover time or slewing rate of the zero detector 84 is a significant parameter, the faster it is, the more precise will be the entire timing — temperature measuring — relationship. As well known, fast slewing rates are costly to purchase. To reduce this problem, a slide back detector 86 is coupled between the zero detector and the flip-flop 42 for the purpose of switching faster than the slewing rate of the zero detector.

With reference to FIG. 4, the zero detector, which can be an operational amplifier circuit, feeds into the gate 88 of a programmable unijunction element 90. By its nature, a programmable unijunction has a very strong anode to cathode conduction as soon as it turns on, i.e., as soon as its gate is below its anode by a certain value. During the quiescent time period when the zero detector 84 is not slewing, a capacitor 92 which is coupled to the output of the unijunction, is being charged. However, very soon after the slewing starts, the gate 88 is forced sufficiently below the anode of the unijunction to effectively short circuit this element to ground and thereby rapidly feed a strong input to a coupling capacitor 94 which feeds to an input of the flip-flop 42, as shown in FIG. 1.

Turning, finally to the digitalized linearizer 16 in FIG. 3, a bundle 96 of BCD lines from the BCD counters 20 are selectively applied to the inputs of a pair of gates 98 and 100 and a JK flip-flop 102. The Q output of the JK flip-flop also supplies an input to the gate 100. The BCD values which are to be employed are dependent upon the linearizing correction required. For purposes of discussion, it is to be assumed that the thermocouple is of the J alloy type. Experimentation has shown that between 40°F and 200° F this type of thermocouple has a linear response; between 200° F and 1,000° F there is a monotonic error of 1° F for each increase of 20° F; and over 1,000° F a monotonic error of 2° F for each 20° F of increasing temperature within its nominal range of 30°F to 1200°F. It will be appreciated that if a different type of thermocouple were employed, different linearizing correction would be required, and a different BCD bundle 96 and gating arrangement would be employed; however, the same inventive concept would be employed, even if the input transducer was not a thermocouple.

Accordingly, for the example of a J type thermocouple, the first clock pulse which is to be suppressed is the 220th clock pulse, such that after 220 clock pulses only 219 count pulses have been fed to the BCD counters 20. Likewise, to be suppressed are the 240th, 260th, 280th, etc. etc. When the temperature exceeds 1,000° F, two adjacent pulses will be suppressed out of each twenty, i.e., the 1,019th and 1,020th, the 1,039th and 1,040th etc.

From the above, aided by the following description, it will be understood that significant digit values are: odd units (U-odd), units eight and nine (U–8, 9), odd tens (T-odd), two hundred (200), and not one thousand ($\overline{1,000}$). Such inputs are applied as shown in FIG. 3 along with the clock pulses (Clk). The clock pulses also are fed into a second JK flip-flop 104 and a gate 106. The goal of the linearizer 16 is to selectively suppress some of the clock pulses that are fed to the gate 106 so that all count pulses from its output 18 are temperature linearized. Also as shown, a gate 108 receives as inputs the output from the gate 100 and the Q output from the JK flip-flop 104 to thereby define a suppression signal on its output line 110, which controls the linearizer output gate 106. Further provided is a reset generating gate 112 for resetting the flip-flop 102 at $V_0$ and $t_1$.

The linearizer 16 operates in the following manner: On each odd units pulse, the U-odd input goes high to the gate 98. Prior to the cound of 1,000, the $\overline{1,000}$ input line remains high; hence, on odd counts this NAND gate produces a logically true output which is low. Accordingly, on even count pulses its EVEN output line goes high. Each time that the BCD units value is eight, the U–8, 9 input to the gate 100 goes high and, because of normal BCD operation, this input remains high for the count of nine. Similarly, each time that the tens value is odd, i.e., at the count of 10, 30, 50, etc., the T-odd input line is high. Prior to the count of 200, the Q output of the JK flip-flop is low, holding the gate 100 disabled. This causes the gate 108 to produce a logically false output which, since it is a NAND gate, is a high output on the output line 110. Thus, the first 200 clock pulses into the gate 106 are passed to the output line 18.

Bringing together all of these logic conditions, the gate 100 goes true upon the 219th clock pulse so as to suppress the 220th pulse, and each twentieth pulse thereafter, i.e., 240, 260, 280 ... 960, 980 up to the count of 1,000. At that time, the gate 98 is made false by the fact that the $\overline{1,000}$ line is held low continuously; hence, the EVEN output is held high and as a result the T-odd and the U-8, 9 inputs are effective in suppressing the next following pairs of pulses 1,019 and 1,020; 1,039 and 1,040; etc.

It will be appreciated that the flip-flop 104, by responding to its input conditions, divides the clock frequency by two and thereby provides an output to the gate 108, at the end of each suppression operation, to place an enabling signal on the input line 110 to provide required logic gating conditions for the next clock pulse to pass through the gate 106. Otherwise, if the gate 106 was to remain inhibited, no further count pulses cound be transmitted on the output line 18 to the BCD counters 20 and from there back into the linearizer 16 by way of the BCD bundle 96. In that event, the entire pyrometer function would be terminated after the first suppressed clock pulse.

From the foregoing, the detailed operation of the digitalized linearizer and the overall operations of the entire pyrometer, including the improved dual slope integrator with specialize slide back amplifier, should be more than understandable to those skilled in the art, such that the scope of the invention setforth in the accompanying claims will be appreciated.

What is desired to be secured by Letters Patent of the United States is:

1. A pyrometer having digitalized linearizing correction, comprising: dual slope integration circuitry including: a first input for receiving the analog signal of variable temperature measurements, a second input for receiving a fixed reference signal, switching means having two sequential switch conditions for alternate coupling to said first and second inputs and said switching means having output circuitry at which appears, at any instant of time, only one of said input signals, integrating means having an input coupled to said output circuitry and an output at which appears a first ramp signal of a first polarity having a variable slope depending upon the variable temperature measurements and a second ramp signal of opposite polarity defined by said fixed reference input and having a fixed slope, coaction of said switching means and said integrating means causing said first and second ramp signals to be generated sequentially and to lie entirely between a first predetermined level and a variable second level; clock pulse generating means for supplying a train of clock pulses; pulse counting means having an input, a plurality of discrete numeric outputs and readout outputs; linearizing circuitry connected to receive said train of clock pulses and said numeric outputs and having an output coupled to said input of said pulse counting means, said linearizing circuitry being interconnected for response to said discrete outputs for inhibiting the passage of numerically selected ones of said clock pulses to said pulse counting means; and control means having inputs coupled for response alternately to a predetermined pulse count value and to the output from said integrating means when it is at said first predetermined level, said control means having outputs connected to said switching means for initiating the first ramp signal when the output from said integrating means is at said first level, for terminating the first said ramp signal at the time of said predetermined pulse count value, at which time it is at said second level, for commencing the second ramp signal at that time and for terminating the second ramp signal when said first level is reobtained; the output from said control means which is responsive to said first level also being coupled to said pulse counting means for strobing the digit value therein for readout purposes.

2. A pyrometer according to claim 1 in which said control means includes coincidence gating means having an one input a signal responsive to said first predetermined level, and a relaxation oscillator providing a relatively slow train of pulses for a second input to said gating means and eliciting therefrom a strobe pulse for the readout purposes of said pulse counting means.

3. A pyrometer according to claim 1 in which said control means includes reset means coupled for response to the reobtaining of said first level and having outputs connected to said pulse counting means and said linearizing circuitry for resetting same upon the reobtaining of said first level.

4. A pyrometer according to claim 1 in which said switching means comprises a pair of parallel connected paths with one such path being connected to receive the analog signal value and the other path connected to receive the fixed reference, said other path including a variable impedance for preadjusting the value of said fixed reference, as seen by said integrating means, for fine tuning said first ramp signal for digitalized matching with the output from said clock pulse generator, such that each count pulse represents one degree of measured temperature.

5. A pyrometer according to claim 1 in which said pulse counting means comprises BCD counting means, pulse count latching means responsive to a strobing signal from the output of said control means for latching the count in the BCD counting means at the time of the strobe signal, and decoding and digitalized readout means for display of the latched pulse count.

6. A pyrometer according to claim 1 in which said integrating circuit has at its output circuit means for increasing its slewing rate, whereby the termination of said second ramp signal is defined with considerable precision, said circuit means comprising a detector of said first predetermined level and series coupled to the output thereof a slide back detector for increasing the slewing rate of said level detector.

7. A pyrometer according to claim 6 in which said slide back detector comprises a programmable unijunction element having its gate as the input of said detector, a capacitor connected to the output of said unijunction element and in parallel with its cathode, and means coupling the output of said slide back detector to an input of said control means when the gate, at the beginning of the slewing, is forced below the anode to short circuit said unijunction element.

8. A pyrometer according to claim 1 in which said analog signal is derived from a J type thermocouple, said discrete numeric outputs generate a coaction within said linearizing circuitry for defining a response range for a J type thermocouple and for generating a plurality of periodic clock pulse suppression signals within that response range, whereby said output of said linearizing circuitry transmits to said pulse counting means a train of pulses linearized with respect to the variable temperature measurements of a J type thermocouple.

9. A pyrometer according to claim 8 in which said pulse counting means is arranged to operate in a BCD mode and the linearizing circuitry is intercoupled to respond to the inputs of even units, eight units, and odd tens for defining the suppression signals.

10. A pyrometer according to claim 8 in which said switching means includes a pair of parallel paths one of which is arranged to receive the fixed reference signal and includes a variable impedance for fine tuning said first ramp signal such that each count pulse during the first ramp signal precisely represents one degree of measured temperature.

11. A pyrometer according to claim 1 in which said linearizing circuitry comprises logic gating means connected to receive at least most of said plurality of discrete numeric outputs for defining at least a first range of pulse counts and for generating a first plurality of periodically repeating clock pulse suppression signals in said first range, said suppression signals being gated with said train clock pulses at said output of said linearizing circuitry for passing to said pulse counting means all but the suppressed clock pulses.

12. A pyrometer according to claim 11 in which at least one of said discrete numeric outputs defines a second range of pulse counts and said logic gating means is interconnected for genrating a second periodically repeating plurality of pulse suppression signals.

13. A pyrometer according to claim 12 in which said logic gating means is interconnected such that said second plurality of suppression signals includes all of said first plurality and is greater in number, whereby more clock pulses are periodically suppressed during said second range of pulse counts.

14. A pyrometer according to claim 11 in which said logic gating means includes an input means for receiving at least one of said discrete numeric outputs for defining another range of pulse counts and said logic gating means is interconnected for response to the other range of pulses for inhibiting the generating of any pulse suppression signals.

15. A pyrometer according to claim 11 in which said logic gating means includes bistable means coupled to said output of said linearizing circuitry and responsive to said train of clock pulses and said suppression signals for enabling said output to pass a clock pulse subsequent to the suppression of a preceeding clock pulse.

16. A pyrometer having digitalized linearizing correction, comprising: dual slope integration circuitry including: input means for receiving separately the analog signal of variable temperature measurements and a fixed reference signal, integrating means coupled to said input means and having an output at which appear sequentially a first and second ramp signals of opposite polarity representing the reference and temperature input signals, respectively; clock pulse generating means for supplying a train of clock pulses; pulse counting means having an input and a plurality of discrete numeric outputs; linearizing circuitry connected to receive said train of clock pulses and said numeric outputs and having an output coupled to said input of said pulse counting means, said linearizing circuitry including logic gating means interconnected for response to said discrete outputs for generating a plurality of periodically repeating clock pulse suppression signals for inhibiting the passage of numerically selected ones of said clock pulses to said pulse counting means; and control means coupled for response to a predetermined pulse count value from said pulse counting means and to the output from said integrating means when it is at a first predetermined level for sequentially initiating and terminating said first and second ramp signals.

17. A pyrometer according to claim 16 in which said input means comprises a pair of paths connected in parallel, one of which includes a variable impedance for fine tuning one of said ramp signals for digitalized matching with the output from the clock pulse generator, such that each count pulse represents one degree of measured temperature, said input means being constructed and arranged such that said variable impedance has no significant influence upon the analog signal as seen by said integrating means.

18. A pyrometer according to claim 17 in which said integrating means has at its output means for detecting said first predetermined level and a slide back detector for increasing the response rate of said level detector.

19. A pyrometer according to claim 16 in which said logic gating means is interconnected for different responses to said discrete numeric output for defining a plurality of different pulse count repsonse ranges and different generating rates for said clock pulse suppression signals for each said range.

20. A pyrometer according to claim 16 in which said input means includes a pair of parallel connected switches controlled by said control means such that said predetermined pulse count value is accumulated for the entire duration of said first ramp signal, which thereby terminates at a second level variable proportionately with respect to the temperature measurements, and said control means is arranged to effect a strobing of said pulse counting means when said second ramp signal attains said first level.

* * * * *

PO-1050
(5/69)

UNITED STATES PATENT OFFICE
CERTIFICATE OF CORRECTION

Patent No. 3,793,630 Dated February 19, 1974

Inventor(s) ROBERT S. MEIJER

It is certified that error appears in the above-identified patent and that said Letters Patent are hereby corrected as shown below:

Column 7, line 11, change "circuit" to --means--; line 63, change "genrating" to --generating--. Column 8, line 52, change "response" to --slewing--.

Signed and sealed this 8th day of October 1974.

(SEAL)
Attest:

McCOY M. GIBSON JR.
Attesting Officer

C. MARSHALL DANN
Commissioner of Patents